(12) United States Patent
Tamamushi

(10) Patent No.: US 11,984,303 B2
(45) Date of Patent: May 14, 2024

(54) HOLDING METHOD OF EDGE RING, PLASMA PROCESSING APPARATUS, AND SUBSTRATE PROCESSING SYSTEM

(71) Applicant: Tokyo Electron Limited, Tokyo (JP)

(72) Inventor: Gen Tamamushi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 225 days.

(21) Appl. No.: 17/189,858

(22) Filed: Mar. 2, 2021

(65) Prior Publication Data
US 2021/0287883 A1 Sep. 16, 2021

(30) Foreign Application Priority Data

Mar. 11, 2020 (JP) ................. 2020-041748

(51) Int. Cl.
*H01J 37/32* (2006.01)
*H02N 13/00* (2006.01)

(52) U.S. Cl.
CPC .. *H01J 37/32715* (2013.01); *H01J 37/32642* (2013.01); *H01J 37/32733* (2013.01); *H01J 37/32862* (2013.01); *H02N 13/00* (2013.01); *H01J 2237/2007* (2013.01); *H01J 2237/334* (2013.01)

(58) Field of Classification Search
CPC ............. H02N 13/00; H01J 37/32733; H01J 2237/2007
See application file for complete search history.

(56) References Cited

U.S. PATENT DOCUMENTS

| | | | | |
|---|---|---|---|---|
| 2010/0243606 A1* | 9/2010 | Koshimizu | ....... | H01J 37/32174 156/345.44 |
| 2012/0006351 A1* | 1/2012 | Jun | ................. | H01J 37/32862 134/1.1 |
| 2012/0160808 A1* | 6/2012 | Kikuchi | ............. | H01L 21/6831 156/345.52 |
| 2016/0189994 A1* | 6/2016 | Sasaki | ................... | H02N 13/00 361/234 |
| 2018/0350565 A1* | 12/2018 | Matsuyama | ...... | H01J 37/32532 |
| 2019/0267218 A1* | 8/2019 | Wang | ............... | H01L 21/67109 |

FOREIGN PATENT DOCUMENTS

| | | | |
|---|---|---|---|
| JP | 2016122740 A | 7/2016 | |
| JP | 2018206935 A | 12/2018 | |

\* cited by examiner

*Primary Examiner* — Keath T Chen
*Assistant Examiner* — Margaret Klunk
(74) *Attorney, Agent, or Firm* — Studebaker & Brackett PC

(57) ABSTRACT

A first electrostatic chuck of a substrate support of the disclosed plasma processing apparatus has first and second electrodes and holds an edge ring. A second electrostatic chuck of the substrate support holds a substrate. The first electrode extends closer to the second electrostatic chuck than the second electrode. During plasma processing, a first voltage having a positive polarity is applied to the first and second electrodes. In a first period after the plasma processing, a second voltage having a negative polarity is applied to the first and second electrodes. In a second period after the first period, a third voltage having a positive polarity is applied to the first electrode, and a fourth voltage having a negative polarity is applied to the second electrode. The absolute value of the third voltage is smaller than the absolute value of the first voltage and the absolute value of the second voltage.

15 Claims, 7 Drawing Sheets

HOLDING METHOD OF EDGE RING, PLASMA PROCESSING APPARATUS, AND SUBSTRATE PROCESSING SYSTEM

CROSS-REFERENCE TO RELATED APPLICATIONS

This application is based on and claims the benefit of priority from Japanese Patent Application No. 2020-041748 filed on March 11, 2020, the entire contents of which are incorporated herein by reference.

FIELD

Exemplary embodiments of the present disclosure relate to a holding method of an edge ring, a plasma processing apparatus, and a substrate processing system.

BACKGROUND

Plasma processing on a substrate is performed using a plasma processing apparatus. The plasma processing apparatus is provided with a chamber and a substrate support. The substrate support is configured to support an edge ring and a substrate. The substrate support includes an electrostatic chuck. The substrate is disposed on the electrostatic chuck and in a region surrounded by the edge ring.

The electrostatic chuck of each of the plasma processing apparatuses disclosed in Japanese Unexamined Patent Publication No. 2016-122740 and Japanese Unexamined Patent Publication No. 2018-206935 has two electrodes in order to hold an edge ring. The edge ring is held by the electrostatic chuck by applying voltages of the same polarity or different polarities to the two electrodes.

SUMMARY

In an exemplary embodiment, a holding method of an edge ring is provided. The holding method includes applying a first voltage to a first electrode and a second electrode of a first electrostatic chuck of a substrate support to hold an edge ring by the first electrostatic chuck during plasma processing on a substrate in a chamber of a plasma processing apparatus. The first voltage has a positive polarity. The plasma processing is performed in a state where the substrate is placed on a second electrostatic chuck of the substrate support in a region surrounded by the edge ring. The holding method further includes applying a second voltage to the first electrode and the second electrode to hold the edge ring by the first electrostatic chuck in a first period after the plasma processing and after the substrate is transferred out of the chamber. The second voltage has a negative polarity. In the first period, cleaning of the chamber is performed using a plasma generated in the chamber. The holding method further includes applying a third voltage and a fourth voltage to the first electrode and the second electrode, respectively, to hold the edge ring by the first electrostatic chuck in a second period after the first period. In the second period, cleaning of the chamber is performed using a plasma generated in the chamber. The first electrode extends closer to the second electrostatic chuck than the second electrode. The third voltage has a positive polarity. The fourth voltage has a negative polarity. An absolute value of the third voltage is smaller than an absolute value of the first voltage and an absolute value of the second voltage and is equal to or smaller than an absolute value of the fourth voltage.

In another exemplary embodiment, a holding method of an edge ring is provided. The holding method includes applying voltages having different polarities to a first electrode and a second electrode of a first electrostatic chuck of a substrate support provided in a chamber of a plasma processing apparatus to hold an edge ring by the first electrostatic chuck. The applying voltages is performed during cleaning of the chamber using a plasma in the plasma processing apparatus. The substrate support has a second electrostatic chuck for holding a substrate placed thereon in a region surrounded by the edge ring. The first electrode extends closer to the second electrostatic chuck than the second electrode. In the applying voltages, a voltage having a negative polarity is applied to the second electrode, and a voltage having an absolute value smaller than an absolute value of the voltage applied to the second electrode and having a positive polarity is applied to the first electrode. The holding method further includes transferring a substrate into the region surrounded by the edge ring and onto the second electrostatic chuck of the substrate support after the applying voltages.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
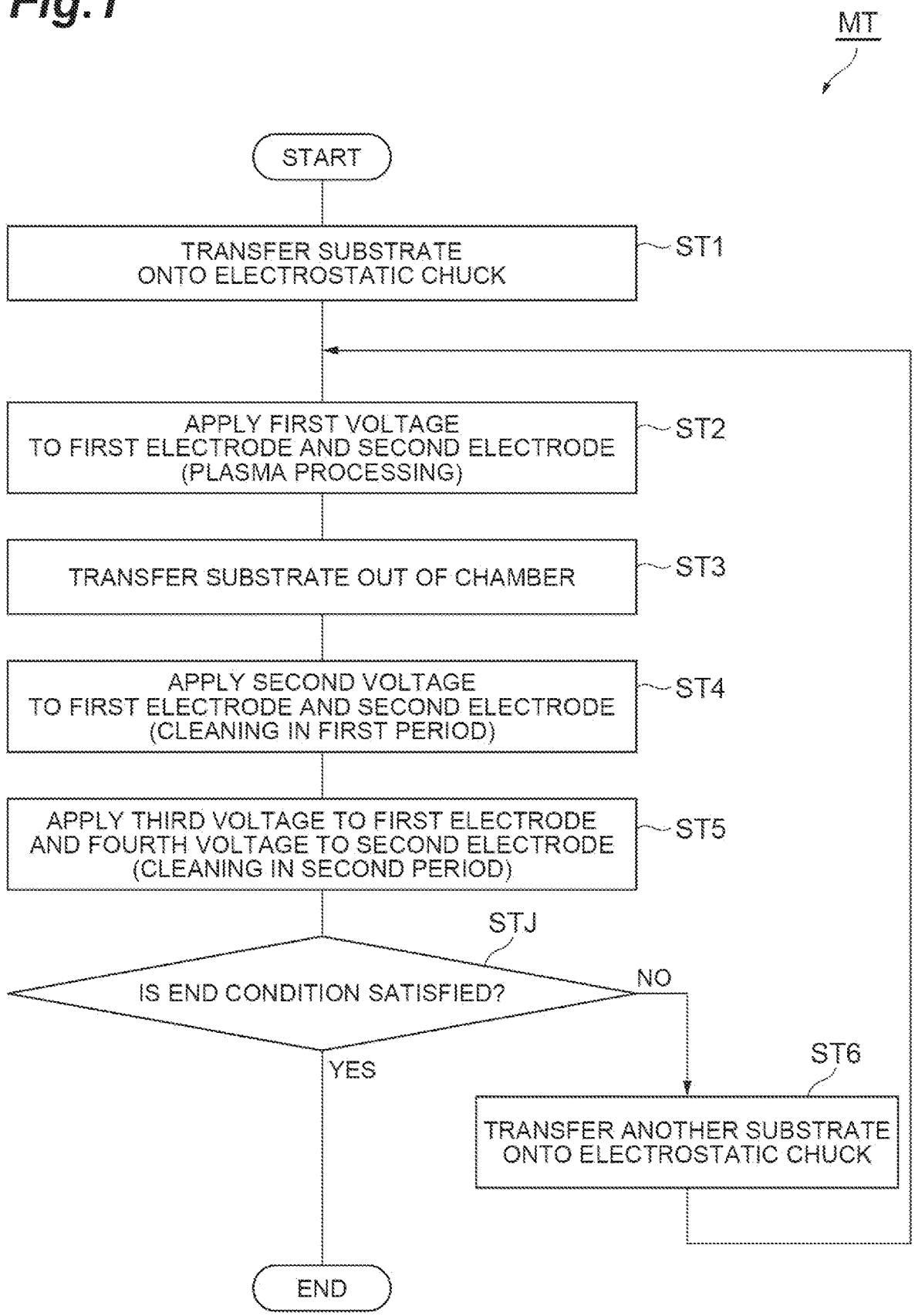
FIG. 1 is a flowchart of a holding method of an edge ring according to an exemplary embodiment.

Hereinafter, various exemplary embodiments will be described.

In an exemplary embodiment, a holding method of an edge ring is provided. The holding method includes applying a first voltage to a first electrode and a second electrode of a first electrostatic chuck of a substrate support to hold an edge ring by the first electrostatic chuck during plasma processing on a substrate in a chamber of a plasma processing apparatus. The first voltage has a positive polarity. The plasma processing is performed in a state where the substrate is placed on a second electrostatic chuck of the substrate support in a region surrounded by the edge ring. The holding method further includes applying a second voltage to the first electrode and the second electrode to hold the edge ring by the first electrostatic chuck in a first period after the plasma processing and after the substrate is transferred out of the chamber. The second voltage has a negative polarity. In the first period, cleaning of the chamber is performed using a plasma generated in the chamber. The holding method further includes applying a third voltage and a fourth voltage to the first electrode and the second electrode, respectively, to hold the edge ring by the first electrostatic chuck in a second period after the first period. In the second period, cleaning of the chamber is performed using a plasma generated in the chamber. The first electrode extends closer to the second electrostatic chuck than the second electrode. The third voltage has a positive polarity. The fourth voltage has a negative polarity. An absolute value of the third voltage is smaller than an absolute value of the first voltage and an absolute value of the second voltage and is equal to or smaller than an absolute value of the fourth voltage.

In the above embodiment, the second voltage that is used in the first period to prevent charge migration has a polarity opposite to the polarity of the first voltage that is used during the plasma processing, that is, a negative polarity. In the second period after the first period, the third voltage having a positive polarity and having a relatively low value is applied to the first electrode extending relatively close to the second electrostatic chuck, and the fourth voltage having a negative polarity is applied to the second electrode. As a result, misalignment of another substrate that is transferred onto the second electrostatic chuck after cleaning is prevented.

In an exemplary embodiment, the absolute value of the third voltage may be smaller than the absolute value of the fourth voltage.

In an exemplary embodiment, the absolute value of the fourth voltage may be equal to the absolute value of the first voltage and the absolute value of the second voltage.

In an exemplary embodiment, the absolute value of the second voltage may be equal to the absolute value of the first voltage. In a case where the absolute value of the second voltage is equal to the absolute value of the first voltage, the charge migration is prevented more effectively.

In an exemplary embodiment, the plasma generated in the first period may be a plasma generated from oxygen gas. The plasma generated in the second period may be a plasma generated from nitrogen gas.

In an exemplary embodiment, the holding method further includes transferring an other substrate onto the second electrostatic chuck by a transfer device, after the applying a third voltage and a fourth voltage. The plasma processing is further performed on the other substrate in a state where the other substrate is placed on the second electrostatic chuck and the edge ring is held by the first electrostatic chuck by applying the first voltage to the first electrode and the second electrode.

In another exemplary embodiment, a plasma processing apparatus is provided. The plasma processing apparatus includes a chamber, a substrate support, a power source device, and a controller. The substrate support is configured to support a substrate in the chamber. The substrate support has a first electrostatic chuck and a second electrostatic chuck. The first electrostatic chuck is configured to hold an edge ring placed thereon. The second electrostatic chuck is configured to hold the substrate placed thereon. The first electrostatic chuck has a first electrode and a second electrode. The first electrode extends closer to the second electrostatic chuck than the second electrode. The power source device includes one or more direct-current power sources. The power source device is configured to generate a voltage to be applied to the first electrode and the second electrode. The controller is configured to control the power source device to apply a first voltage having a positive polarity to the first electrode and the second electrode in order to hold the edge ring by the first electrostatic chuck during plasma processing on the substrate placed on the second electrostatic chuck. The power source device is configured to control the power source device to apply a second voltage having a negative polarity to the first electrode and the second electrode in order to hold the edge ring by the first electrostatic chuck, in a first period after the plasma processing and after the substrate is transferred out of the chamber. In the first period, cleaning of the chamber using a plasma generated in the chamber is performed. The controller is configured to control the power source device to apply a third voltage to the first electrode and apply a fourth voltage to the second electrode, in order to hold the edge ring by the first electrostatic chuck, in a second period. The second period is a period after the first period. In the second period, cleaning of the chamber is performed using a plasma generated in the chamber. The third voltage has a positive polarity, and the fourth voltage has a negative polarity. The absolute value of the third voltage is smaller than an absolute value of the first voltage and an absolute value of the second voltage and is equal to or smaller than an absolute value of the fourth voltage.

In an exemplary embodiment, the absolute value of the third voltage may be smaller than the absolute value of the fourth voltage.

In an exemplary embodiment, the absolute value of the fourth voltage may be equal to the absolute value of the first voltage and the absolute value of the second voltage.

In an exemplary embodiment, the absolute value of the second voltage may be equal to the absolute value of the first voltage.

In still another exemplary embodiment, a substrate processing system is provided. The substrate processing system includes the plasma processing apparatus of any one of the aforementioned exemplary embodiments and a transfer device. The controller is configured to control the transfer device to transfer an other substrate onto the second electrostatic chuck after the cleaning in the second period. The controller is configured to control the power source device to apply the first voltage to the first electrode and the second electrode in order to hold the edge ring by the first electrostatic chuck during the plasma processing on the other substrate placed on the second electrostatic chuck.

In still another exemplary embodiment, a holding method of an edge ring is provided. The holding method includes applying voltages having different polarities to a first electrode and a second electrode of a first electrostatic chuck of a substrate support provided in a chamber of a plasma processing apparatus to hold an edge ring by the first electrostatic chuck. The applying voltages is performed during cleaning of the chamber using a plasma in the plasma processing apparatus. The substrate support has a second electrostatic chuck for holding a substrate placed thereon in a region surrounded by the edge ring. The first electrode extends closer to the second electrostatic chuck than the second electrode. In the applying voltages, a voltage having a negative polarity is applied to the second electrode, and a voltage having an absolute value smaller than an absolute value of the voltage applied to the second electrode and having a positive polarity is applied to the first electrode. The holding method further includes transferring a substrate into the region surrounded by the edge ring and onto the second electrostatic chuck of the substrate support after the applying voltages.

Hereinafter, various exemplary embodiments will be described in detail with reference to the drawings. In the drawings, the same or equivalent portions are denoted by the same reference symbols.

FIG. 1 is a flowchart of a holding method of an edge ring according to an exemplary embodiment. The holding method (hereinafter referred to as a "method MT") shown in FIG. 1 may be applied to a substrate processing system or a plasma processing apparatus.

Figure 2:
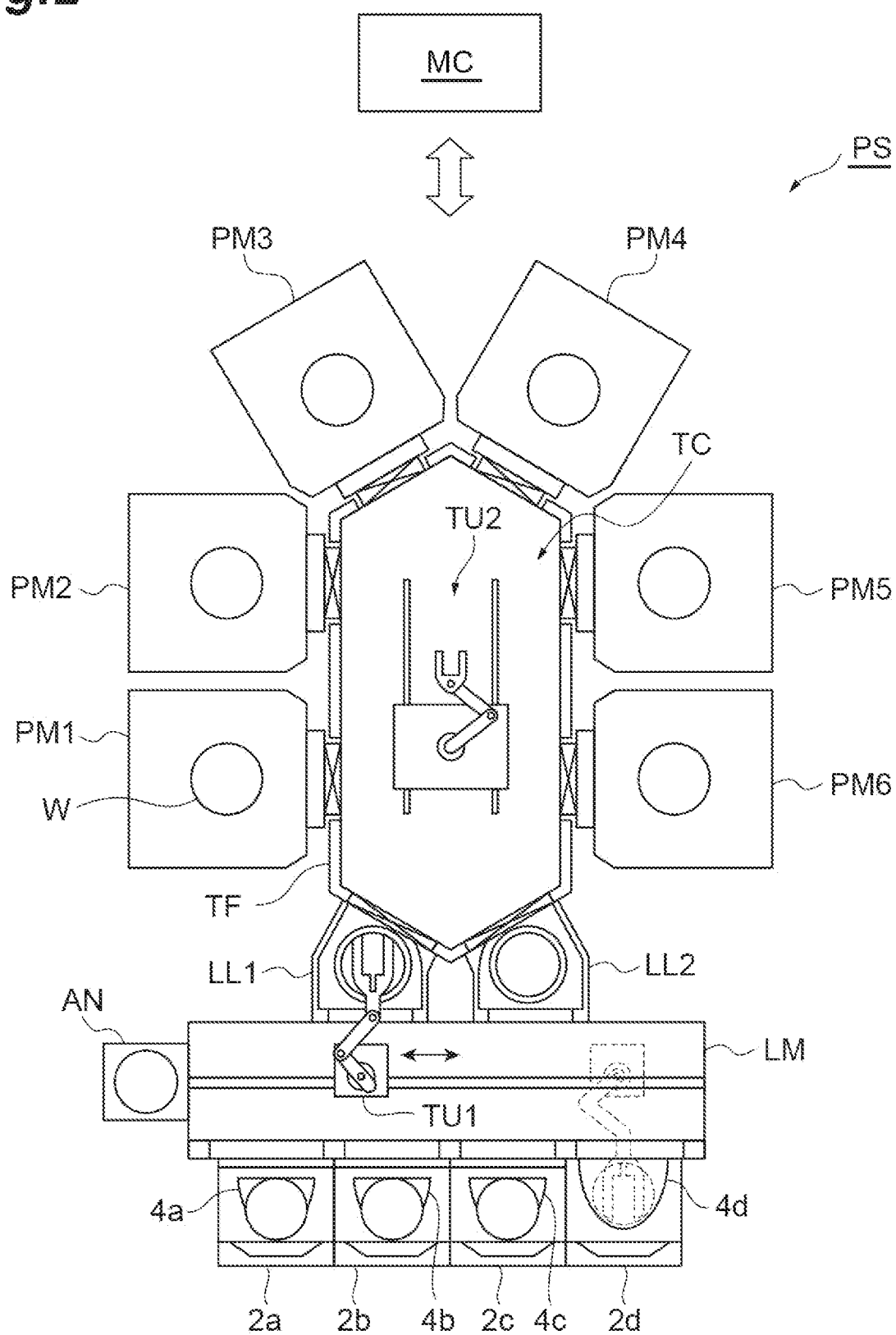
FIG. 2 illustrates a substrate processing system according to an exemplary embodiment.

FIG. 2 illustrates a substrate processing system according to an exemplary embodiment. A substrate processing system PS shown in FIG. 2 includes stands 2a to 2d, containers 4a to 4d, a loader module LM, an aligner AN, load lock modules LL1 and LL2, process modules PM1 to PM6, a transfer module TF, and a controller MC. The number of stands, the number of containers, and the number of load lock modules in the substrate processing system PS may be any number of one or more. Further, the number of process modules in the substrate processing system PS may be any number of one or more.

The stands 2a to 2d are arranged along one edge of the loader module LM. The containers 4a to 4d are respectively mounted on the stands 2a to 2d. Each of the containers 4a to 4d is, for example, a container called a front opening unified pod (FOUP). Each of the containers 4a to 4d is configured to accommodate a substrate W therein.

The loader module LM has a chamber. The pressure in the chamber of the loader module LM is set to atmospheric pressure. The loader module LM has a transfer device TU1. The transfer device TU1 is, for example, an articulated robot and is controlled by the controller MC. The transfer device TU1 is configured to transfer the substrate W through the chamber of the loader module LM. The transfer device TU1 can transfer the substrate W between each of the containers 4a to 4d and the aligner AN, between the aligner AN and each of the load lock modules LL1 and LL2, and between each of the load lock modules LL1 and LL2 and each of the containers 4a to 4d. The aligner AN is connected to the loader module LM. The aligner AN is configured to perform adjustment of the position (correction of the position) of the substrate W.

Each of the load lock module LL1 and the load lock module LL2 is provided between the loader module LM and the transfer module TF. Each of the load lock module LL1 and the load lock module LL2 provides a preliminary decompression chamber.

The transfer module TF is connected to each of the load lock module LL1 and the load lock module LL2 through a gate valve. The transfer module TF has a transfer chamber TC capable of being depressurized. The transfer module TF has a transfer device TU2. The transfer device TU2 is, for example, an articulated robot and is controlled by the controller MC. The transfer device TU2 is configured to transfer the substrate W through the transfer chamber TC. The transfer device TU2 can transfer the substrate W between each of the load lock modules LL1 and LL2 and each of the process modules PM1 to PM6, and between any two process modules among the process modules PM1 to PM6.

Each of the process modules PM1 to PM6 is an apparatus configured to perform dedicated substrate processing. At least one process module among the process modules PM1 to PM6 is a plasma processing apparatus according to an exemplary embodiment which will be described later.

The controller MC is configured to control each part of the substrate processing system PS. The controller MC may be a computer which includes a processor, a storage device, an input device, a display device, and the like. The controller MC executes a control program stored in the storage device and controls each part of the substrate processing system PS, based on recipe data stored in the storage device. The method MT can be performed in the substrate processing system PS by the control of each part of the substrate processing system PS by the controller MC.

Figure 3:
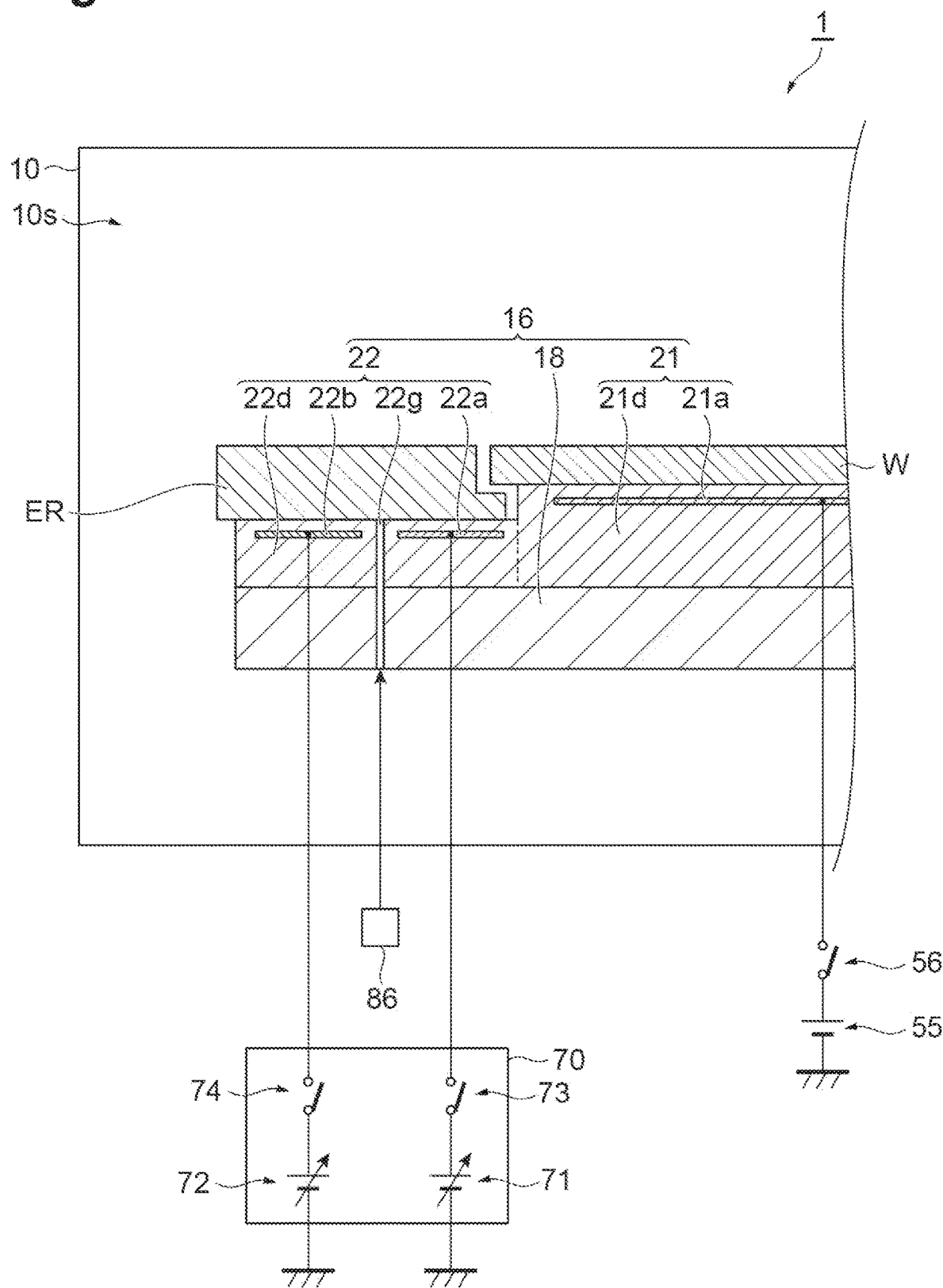
FIG. 3 schematically illustrates a plasma processing apparatus according to an exemplary embodiment.
Figure 4:
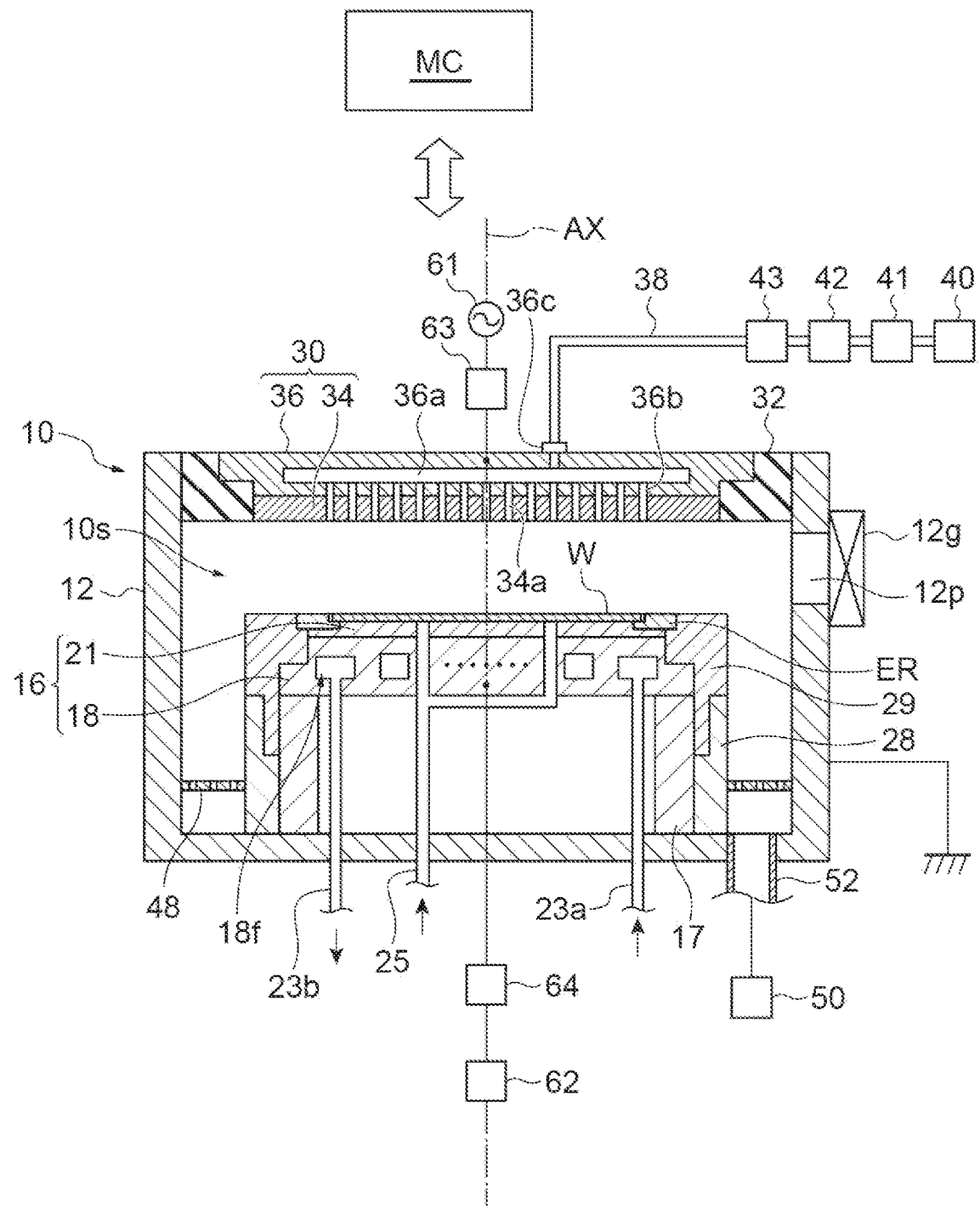
FIG. 4 illustrates a configuration in a chamber of the plasma processing apparatus according to an exemplary embodiment.

FIG. 3 schematically illustrates a plasma processing apparatus according to an exemplary embodiment. A plasma processing apparatus 1 shown in FIG. 3 may be adopted as at least one of the process modules PM1 to PM6 of the substrate processing system PS. The plasma processing apparatus 1 is provided with a chamber 10. FIG. 4 illustrates a configuration in a chamber of the plasma processing apparatus according to an exemplary embodiment. As shown in FIG. 4, the plasma processing apparatus 1 may be a capacitively coupled plasma processing apparatus.

The chamber 10 provides an internal space 10s therein. The central axis of the internal space 10s is an axis AX which extends in the vertical direction. In an embodiment, the chamber 10 includes a chamber body 12. The chamber body 12 has a substantially cylindrical shape. The internal space 10s is provided in the chamber body 12. The chamber body 12 is formed of, for example, aluminum. The chamber body 12 is electrically grounded. A film having plasma resistance is formed on the inner wall surface of the chamber body 12, that is, the wall surface defining the internal space 10s. This film may be a film formed by anodization or a ceramic film such as a film formed of yttrium oxide.

A passage 12p is formed in a side wall of the chamber body 12. The substrate W passes through the passage 12p when it is transferred between the internal space 10s and the outside of the chamber 10. A gate valve 12g is provided along the side wall of the chamber body 12 for opening and closing of the passage 12p.

The plasma processing apparatus 1 is further provided with a substrate support 16. The substrate support 16 is configured to support the substrate W placed thereon in the chamber 10. The substrate W has a substantially disk shape. The substrate support 16 is supported by the support 17. The support 17 extends upward from a bottom portion of the chamber body 12. The support 17 has a substantially cylindrical shape. The support 17 is formed of an insulating material such as quartz.

The substrate support 16 has a lower electrode 18, an electrostatic chuck 21, and an electrostatic chuck 22. The lower electrode 18, the electrostatic chuck 21, and the electrostatic chuck 22 are provided in the chamber 10.

The lower electrode 18 is formed of a conductive material such as aluminum and has a substantially disk shape. A flow path 18f is provided in the lower electrode 18. The flow path 18f is a flow path for a heat exchange medium. As the heat exchange medium, for example, a liquid refrigerant is used. A supply device for the heat exchange medium (for example, a chiller unit) is connected to the flow path 18f. The supply device is provided outside the chamber 10. The heat exchange medium is supplied from the supply device to the flow path 18f through a pipe 23a. The heat exchange medium supplied to the flow path 18f is returned to the supply device through a pipe 23b.

The electrostatic chuck 21 and the electrostatic chuck 22 are provided on the lower electrode 18. The electrostatic chuck 21 is a second electrostatic chuck in an embodiment. The electrostatic chuck 21 is configured to hold the substrate W placed thereon. The substrate W may have a substantially disk shape. The electrostatic chuck 22 is a first electrostatic chuck in an embodiment. The electrostatic chuck 22 is configured to hold an edge ring ER placed thereon. The edge ring ER is a plate having a substantially ring shape. The edge ring ER is formed of, for example, silicon, silicon carbide, or quartz. The edge ring ER is placed on the electrostatic chuck 22 such that the central axis thereof coincides with the axis AX. The substrate W accommodated in the chamber 10 is disposed on the electrostatic chuck 21 and in a region surrounded by the edge ring ER.

The plasma processing apparatus 1 may be further provided with a gas line 25. The gas line 25 supplies a heat transfer gas, for example, a He gas, from a gas supply mechanism to a gap between the upper surface of the electrostatic chuck 21 and the rear surface (lower surface) of the substrate W.

The plasma processing apparatus 1 may be further provided with an outer peripheral portion 28 and an outer peripheral portion 29. The outer peripheral portion 28 extends upward from the bottom portion of the chamber body 12. The outer peripheral portion 28 has a substantially cylindrical shape and extends along the outer periphery of the support 17. The outer peripheral portion 28 is formed of a conductive material. The outer peripheral portion 28 is electrically grounded. A film having plasma resistance is formed on the surface of the outer peripheral portion 28. This film may be a film formed by anodization or a ceramic film such as a film formed of yttrium oxide.

The outer peripheral portion 29 is provided on the outer peripheral portion 28. The outer peripheral portion 29 is formed of a material having insulation properties. The outer peripheral portion 29 is formed of ceramic such as quartz. The outer peripheral portion 29 has a substantially cylindrical shape. The outer peripheral portion 29 extends along the outer peripheries of the lower electrode 18 and the The plasma processing apparatus 1 is further provided with an upper electrode 30. The upper electrode 30 is provided above the substrate support 16. The upper electrode 30 closes an upper opening of the chamber body 12 together with a member 32. The member 32 has insulation properties. The upper electrode 30 is supported on an upper portion of the chamber body 12 through the member 32.

The upper electrode 30 includes a ceiling plate 34 and a support 36. The lower surface of the ceiling plate 34 defines the internal space 10s. A plurality of gas discharge holes 34a are formed in the ceiling plate 34. Each of the plurality of gas discharge holes 34a penetrates the ceiling plate 34 in a plate thickness direction (the vertical direction). The ceiling plate 34 is formed of, for example, silicon. Alternatively, the ceiling plate 34 may have a structure in which a plasma-resistant film is provided on the surface of a member made of aluminum. This film may be a film formed by anodization or a ceramic film such as a film formed of yttrium oxide.

The support 36 detachably supports the ceiling plate 34. The support 36 is formed of a conductive material such as aluminum, for example. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply gases from one or more gas sources selected from the plurality of gas sources of the gas source group 40 to the internal space 10s at individually adjusted flow rates.

A baffle plate 48 is provided between the outer peripheral portion 28 and the side wall of the chamber body 12. The baffle plate 48 may be configured, for example, by coating a member made of aluminum with ceramic such as yttrium oxide. A number of through-holes are formed in the baffle plate 48. An exhaust pipe 52 is connected to the bottom portion of the chamber body 12 below the baffle plate 48. An exhaust device 50 is connected to the exhaust pipe 52. The exhaust device 50 has a pressure controller such as an automatic pressure control valve, and a vacuum pump such as a turbo molecular pump, and can reduce the pressure in the internal space 10s.

The plasma processing apparatus 1 is further provided with a radio frequency power source 61. The radio frequency power source 61 is connected to the upper electrode 30 through a matcher 63. The radio frequency power source 61 is a power source that is configured to generate radio frequency power for plasma generation. The radio frequency power generated by the radio frequency power source 61 has a first frequency in the range of 27 MHz or more and 100 MHz or less. The first frequency is, for example, 40 MHz or 60 MHz. The matcher 63 has a matching circuit for matching the impedance on the load side (the lower electrode 18 side) of the radio frequency power source 61 with the output impedance of the radio frequency power source 61. The radio frequency power source 61 does not need to be electrically connected to the upper electrode 30, and may be connected to the lower electrode 18 through the matcher 63.

The plasma processing apparatus 1 may be further provided with a bias power source 62. The bias power source 62 is electrically connected to the lower electrode 18 through a matcher 64. The bias power source 62 generates an electrical bias. The electrical bias is applied to the lower electrode 18. In an embodiment, the electrical bias may be radio frequency bias power. The radio frequency bias power has a second frequency. The second frequency may be a frequency lower than the first frequency. The second frequency is, for example, a frequency in the range of 50 kHz or more and 27 MHz or less. In this embodiment, the bias power source 62 is connected to the lower electrode 18 through the matcher 64. The matcher 64 has a matching circuit configured to match the impedance on the load side (the lower electrode 18 side) of the bias power source 62 with the output impedance of the bias power source 62.

In another embodiment, the electrical bias may be a pulse wave that includes a pulse of negative direct-current voltage and is periodically generated at a cycle that is defined at the second frequency. In this embodiment, the matcher 64 may be omitted. The second frequency is, for example, a frequency in the range of 50 kHz or more and 27 MHz or less. The voltage level of the pulse wave may be 0 V in a period other than the period in which the pulse of the negative direct-current voltage continues in the cycle. Alternatively, the voltage of the pulse wave may have an absolute value lower than the absolute value of the voltage of the pulse in a period other than the period in which the pulse of the negative direct-current voltage continues in the cycle. The voltage level of the pulse may change temporally.

In the plasma processing apparatus 1, a radio frequency electric field is generated in the chamber 10 by the radio frequency power from the radio frequency power source 61. The gas in the chamber 10 is excited by the generated radio frequency electric field. As a result, a plasma is generated in the chamber 10. The substrate W is processed with chemical species such as ions and/or radicals from the generated plasma.

Hereinafter, the electrostatic chuck 21 and the electrostatic chuck 22 of the substrate support 16 will be described in detail. The electrostatic chuck 21 extends to intersect the axis AX. The electrostatic chuck 22 extends in a circumferential direction on the outside in a radial direction with respect to the electrostatic chuck 21.

The electrostatic chuck 21 is configured to hold the substrate W placed thereon (that is, on the upper surface thereof). The electrostatic chuck 21 has a dielectric portion 21d and an electrode 21a. The dielectric portion 21d is formed of a dielectric such as aluminum nitride or aluminum oxide. The dielectric portion 21d has a substantially disk shape. The central axis of the electrostatic chuck 21 and the dielectric portion 21d substantially coincides with the axis AX. The electrode 21a is an electrode having a film shape and is provided in the dielectric portion 21d. A direct-current power source 55 is connected to the electrode 21a through a switch 56. When a direct-current voltage from the direct-current power source 55 is applied to the electrode 21a, an electrostatic attraction force is generated between the electrostatic chuck 21 and the substrate W. The substrate W is attracted to the electrostatic chuck 21 by the generated electrostatic attraction force and is held by the electrostatic chuck 21.

The electrostatic chuck 22 is configured to hold the edge ring ER placed thereon. The electrostatic chuck 22 has a dielectric portion 22d, a first electrode 22a, and a second electrode 22b. The dielectric portion 22d is formed of a dielectric such as aluminum nitride or aluminum oxide. The dielectric portion 22d extends in the circumferential direction on the outside in the radial direction with respect to the dielectric portion 21d. The central axis of the dielectric portion 22d substantially coincides with the axis AX. In an embodiment, the thickness of the dielectric portion 22d is smaller than the thickness of the dielectric portion 21d. The position of the upper surface of the dielectric portion 22d in the vertical direction may be lower than the position of the upper surface of the dielectric portion 21d in the vertical direction.

In an embodiment, as shown in FIG. 3, the dielectric portion 21d and the dielectric portion 22d may be configured with a single dielectric member. That is, the electrostatic chuck 21 and the electrostatic chuck 22 may be integrated. In FIG. 3, the boundary between the dielectric portion 21d of the electrostatic chuck 21 and the dielectric portion 22d of the electrostatic chuck 22 is shown by a broken line. The electrostatic chuck 21 and the electrostatic chuck 22 may be separated from each other.

Each of the first electrode 22a and the second electrode 22b is an electrode having a film shape. The first electrode 22a and the second electrode 22b are provided in the dielectric portion 22d. The first electrode 22a extends closer to the electrostatic chuck 21 than the second electrode 22b. In an embodiment, each of the first electrode 22a and the second electrode 22b may extend around the axis AX. Further, each of the first electrode 22a and the second electrode 22b may have a ring shape. In this case, the second electrode 22b extends in the circumferential direction outside the first electrode 22a. The first electrode 22a and the second electrode 22b may extend at substantially the same height position in the vertical direction.

The plasma processing apparatus 1 is further provided with a power source device 70. The power source device 70 is connected to the first electrode 22a and the second electrode 22b. The power source device 70 is configured to generate a voltage which is applied to the first electrode 22a and a voltage which is applied to the second electrode 22b. Each of the voltage which is applied to the first electrode 22a and the voltage which is applied to the second electrode 22b is a direct-current voltage. The power source device 70 has one or more direct-current power sources. In an embodiment, the power source device 70 may have a variable direct-current power source 71, a variable direct-current power source 72, a switch 73, and a switch 74. The variable direct-current power source 71 is configured to generate the direct-current voltage which is applied to the first electrode 22a. The variable direct-current power source 71 is connected to the first electrode 22a through the switch 73. The variable direct-current power source 72 is configured to generate the direct-current voltage which is applied to the second electrode 22b. The variable direct-current power source 72 is connected to the second electrode 22b through the switch 74.

When the voltage from the power source device 70 is applied to each of the first electrode 22a and the second electrode 22b, an electrostatic attraction force is generated between the electrostatic chuck 22 and the edge ring ER. The edge ring ER is attracted to the electrostatic chuck 22 by the generated electrostatic attraction force and is held by the electrostatic chuck 22.

The electrostatic chuck 22 may further have a gas line 22g. The gas line 22g is a gas line provided for supplying heat transfer gas, for example, a He gas, to the gap between the electrostatic chuck 22 and the edge ring ER. The gas line 22g is connected to a gas supply mechanism 86 which is a heat transfer gas source.

In an embodiment, the controller MC of the substrate processing system PS may configure the controller MC of the plasma processing apparatus 1. In this embodiment, the controller MC can control each part of the plasma processing apparatus 1. The plasma processing apparatus 1 may have an other controller configured to control each part thereof, instead of the controller MC. The other controller may be a computer, similar to the controller MC.

Figure 5:
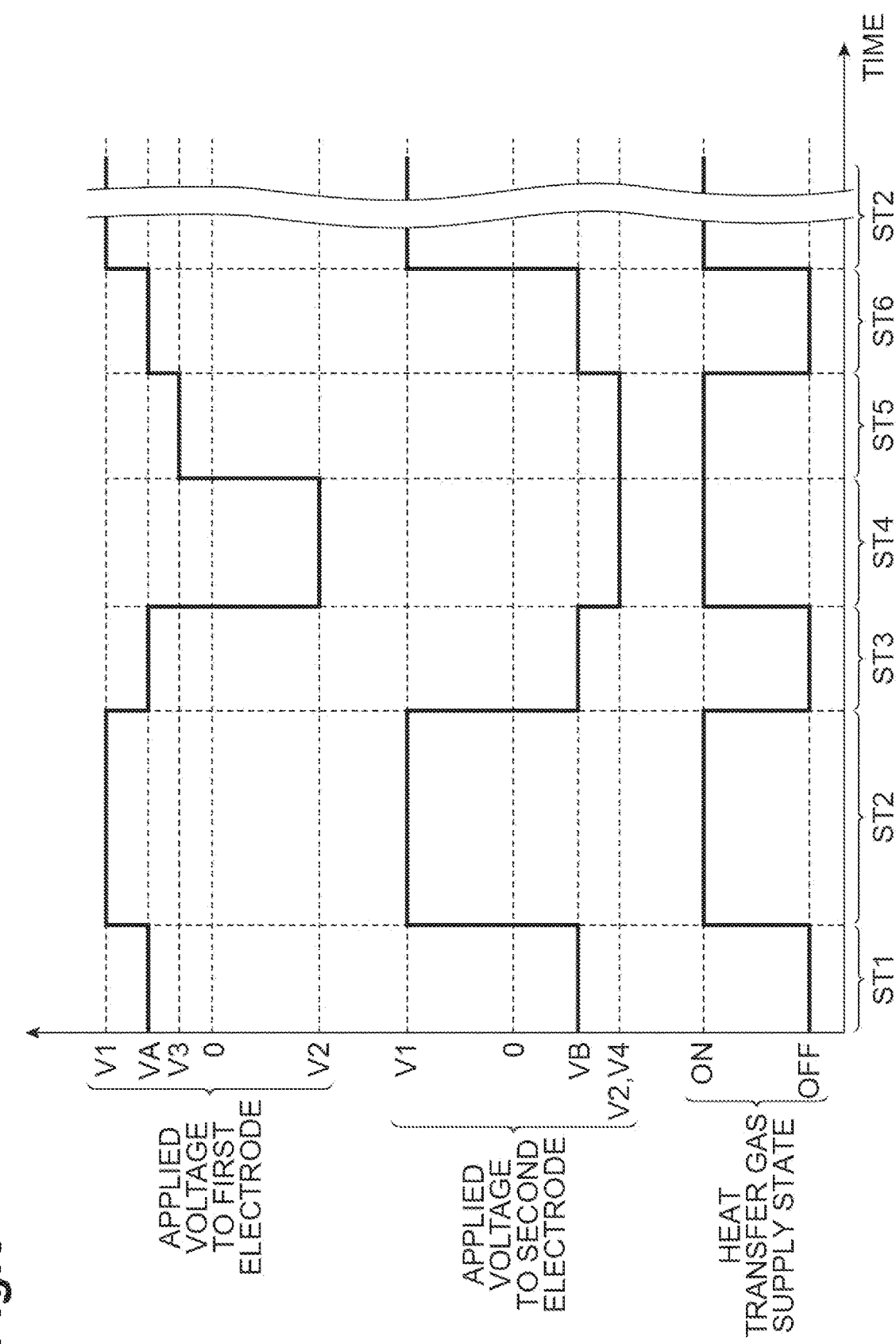
FIG. 5 is a timing chart related to the method shown in FIG. 1.

The method MT will be described with reference to FIG. 1 again. Hereinafter, the controller MC will also be described together with the method MT. In the following description, FIG. 5 will be referred to together with FIG. 1. FIG. 5 is a timing chart related to the method shown in FIG. 1. In FIG. 5, the horizontal axis represents time. In FIG. 5, the vertical axis represents the applied voltage to the first electrode 22a, the applied voltage to the second electrode 22b, and the heat transfer gas supply state from the gas supply mechanism 86. "ON" in the heat transfer gas supply state indicates that the heat transfer gas is supplied to the gap between the electrostatic chuck 22 and the edge ring ER. "OFF" in the heat transfer gas supply state indicates that the heat transfer gas is not supplied to the gap between the electrostatic chuck 22 and the edge ring ER.

In step ST1 of the method MT, the substrate W is transferred onto the electrostatic chuck 21. In step ST1, the controller MC controls the transfer device TU2 to transfer the substrate W onto the electrostatic chuck 21. In the period of step ST1, the edge ring ER is held by the electrostatic chuck 22. As shown in FIG. 5, in the period of step ST1, the applied voltage to the first electrode 22a is a voltage VA, and the applied voltage to the second electrode 22b is a voltage VB. The voltage VA may be a voltage having a positive polarity and the voltage VB may be a voltage having a negative polarity. The absolute value of the voltage VA and the absolute value of the voltage VB may be the same as each other. In the period of step ST1, the controller MC controls the power source device 70 such that the voltage VA and the voltage VB are applied to the first electrode 22a and the second electrode 22b, respectively. In the period of step ST1, the heat transfer gas from the gas supply mechanism 86 is not supplied to the gap between the electrostatic chuck 22 and the edge ring ER. In the period of step ST1, the controller MC controls the gas supply mechanism 86 to stop the supply of the heat transfer gas.

Subsequent step ST2 is performed to hold the edge ring ER by the electrostatic chuck 22 during plasma processing on the substrate W. In the period in which the plasma processing is performed (period of the plasma processing), a processing gas is supplied from the gas supply unit into the chamber 10. In the period of the plasma processing, the pressure of the processing gas in the chamber 10 is set to a designated pressure by the exhaust device 50. Further, in the period of the plasma processing, the radio frequency power is supplied from the radio frequency power source 61. As a result, a plasma is generated from the processing gas in the chamber 10. In the period of the plasma processing, the electrical bias may be supplied from the bias power source 62 to the lower electrode 18. In the period of the plasma processing, the gas supply unit, the exhaust device 50, the radio frequency power source 61, and the bias power source 62 are controlled by the controller MC. In the period of the plasma processing, the substrate W is processed with the chemical species from the plasma. That is, the plasma processing is performed on the substrate W. This plasma processing may be, for example, plasma etching on a film of the substrate W.

In step ST2, a first voltage V1 having a positive polarity is applied to the first electrode 22a and the second electrode 22b in order to hold the edge ring ER by the electrostatic chuck 22. As shown in FIG. 5, the absolute value of the first voltage V1 may be larger than the absolute value of the voltage VA and the absolute value of the voltage VB. In the period of step ST2, the controller MC controls the power source device 70 to apply the first voltage V1 to the first electrode 22a and the second electrode 22b. In the period of step ST2, the heat transfer gas from the gas supply mechanism 86 is supplied to the gap between the electrostatic chuck 22 and the edge ring ER. In the period of step ST2, the controller MC controls the gas supply mechanism 86 to supply the heat transfer gas to the gap between the electrostatic chuck 22 and the edge ring ER. In step ST2, direct-current voltages having different values may be respectively applied to the first electrode 22a and the second electrode 22b such that a potential difference is generated between the first electrode 22a and the second electrode 22b.

In subsequent step ST3, the substrate W is transferred out of the chamber 10. In step ST3, the controller MC controls the transfer device TU2 to transfer the substrate W out of the chamber 10. In the period of step ST3, the edge ring ER is held by the electrostatic chuck 22. As shown in FIG. 5, in the period of step ST3, the applied voltage to the first electrode 22a is the voltage VA, and the applied voltage to the second electrode 22b is the voltage VB. In the period of step ST3, the controller MC controls the power source device 70 to apply the voltage VA and the voltage VB to the first electrode 22a and the second electrode 22b, respectively. In the period of step ST3, the heat transfer gas from the gas supply mechanism 86 is not supplied to the gap between the electrostatic chuck 22 and the edge ring ER. In the period of step ST3, the controller MC controls the gas supply mechanism 86 to stop the supply of the heat transfer gas.

Subsequent step ST4 is performed in a first period after the plasma processing described above and after the substrate W is transferred out of the chamber 10 in step ST3. In the first period, cleaning of the chamber 10 (hereinafter, referred to as "first cleaning") is performed using a plasma generated in the chamber 10. The first cleaning is performed in a state where an object is not placed on the electrostatic chuck 21. The cleaning of the chamber 10 may be performed using the plasma generated in the chamber 10 in a state where a dummy substrate is placed on the electrostatic chuck 21, between step ST3 and step ST4.

In the period in which the first cleaning is performed (period of the first cleaning), a cleaning gas is supplied from the gas supply unit into the chamber 10. In an embodiment, the cleaning gas may include oxygen gas. In the period of the first cleaning, the pressure of the cleaning gas in the chamber 10 is set to a designated pressure by the exhaust device 50. Further, in the period of the first cleaning, the radio frequency power is supplied from the radio frequency power source 61. As a result, the plasma is generated from the cleaning gas in the chamber 10. In the execution period of the first cleaning, the electrical bias may or may not be supplied from the bias power source 62 to the lower electrode 18. In the period of the first cleaning, the gas supply unit, the exhaust device 50, the radio frequency power source 61, and the bias power source 62 are controlled by the controller MC. In the period of the first cleaning, a deposit in the chamber 10 is removed by the chemical species from the plasma. This deposit is produced during the plasma processing on the substrate described above.

In step ST4, in order to hold the edge ring ER by the electrostatic chuck 22, a second voltage V2 having a negative polarity is applied to the first electrode 22a and the second electrode 22b. In an example, in order to prevent the charge migration, the second voltage V2 that is used in step ST4 has a polarity opposite to the polarity of the first voltage V1 that is used during the plasma processing in step ST2. As shown in FIG. 5, the absolute value of the second voltage V2 may be larger than the absolute value of the voltage VA and the absolute value of the voltage VB. The absolute value of the second voltage V2 may be the same as the absolute value of the first voltage V1. In this case, the charge migration is more effectively prevented. Alternatively, the absolute value of the second voltage V2 may be smaller than the absolute value of the first voltage V1. In the period in which step ST4 is performed (period of step ST4), the controller MC controls the power source device 70 to apply the second voltage V2 to the first electrode 22a and the second electrode 22b. In the period of step ST4, the heat transfer gas from the gas supply mechanism 86 is supplied to the gap between the electrostatic chuck 22 and the edge ring ER. In the period of step ST4, the controller MC controls the gas supply mechanism 86 to supply the heat transfer gas to the gap between the electrostatic chuck 22 and the edge ring ER. In step ST4, direct-current voltages having a positive polarity or a negative polarity and having the same value may be applied to the first electrode 22a and the second electrode 22b. Alternatively, in step ST4, direct-current voltages having different values may be applied to the first electrode 22a and the second electrode 22b such that a potential difference is generated between the first electrode 22a and the second electrode 22b.

Subsequent step ST5 is performed in a second period after the first period. In the second period, cleaning of the chamber 10 (hereinafter, referred to as "second cleaning") is performed using the plasma generated in the chamber 10. The second cleaning is executed in a state where an object is not placed on the electrostatic chuck 21.

In the execution period of the second cleaning, a cleaning gas is supplied from the gas supply unit into the chamber 10. In an embodiment, the cleaning gas may include nitrogen gas. In the period in which the second cleaning is performed (period of the second cleaning), the pressure of the cleaning gas in the chamber 10 is set to a designated pressure by the exhaust device 50. Further, in the period of the second cleaning, the radio frequency power is supplied from the radio frequency power source 61. As a result, a plasma is generated from the cleaning gas in the chamber 10. In the period of the second cleaning, the electrical bias may or may not be supplied from the bias power source 62 to the lower electrode 18. In the period of the second cleaning, the gas supply unit, the exhaust device 50, the radio frequency power source 61, and the bias power source 62 are controlled by the controller MC. In the period of the second cleaning, a deposit in the chamber 10 is removed by the chemical species from the plasma.

In step ST5, in order to hold the edge ring ER by the electrostatic chuck 22, a third voltage V3 is applied to the first electrode 22a and a fourth voltage V4 is applied to the second electrode 22b. As shown in FIG. 5, the third voltage V3 has a positive polarity, and the fourth voltage V4 has a negative polarity. The absolute value of the third voltage V3 is smaller than the absolute value of the first voltage V1 and the absolute value of the second voltage V2, and is equal to or smaller than the absolute value of the fourth voltage V4. The absolute value of the third voltage V3 may be smaller than the absolute value of the fourth voltage V4. The absolute value of the fourth voltage V4 may be equal to the absolute value of the first voltage V1 and the absolute value of the second voltage V2. In the period in which step ST5 is performed (period of ST5), the controller MC controls the power source device 70 to apply the third voltage V3 to the first electrode 22a and apply the fourth voltage V4 to the second electrode 22b. In the period of step ST5, the heat transfer gas from the gas supply mechanism 86 is supplied to the gap between the electrostatic chuck 22 and the edge ring ER. In the period of step ST5, the controller MC controls the gas supply mechanism 86 to supply the heat transfer gas to the gap between the electrostatic chuck 22 and the edge ring ER. The length of the period of step ST5 may be 10 seconds or more.

In subsequent step STJ, it is determined whether or not an end condition is satisfied. The end condition is satisfied when there is no other substrate to which plasma processing is to be applied. In a case where it is determined in step STJ that the end condition is not satisfied, step ST6 is executed.

In step ST6, another substrate is transferred onto the electrostatic chuck 21. In step ST6, the controller MC controls the transfer device TU2 to transfer an other substrate onto the electrostatic chuck 21. In the period in which step ST6 is performed (period of ST6), the edge ring ER is held by the electrostatic chuck 22. As shown in FIG. 5, in the period of step ST6, the applied voltage to the first electrode 22a is the voltage VA, and the applied voltage to the second electrode 22b is the voltage VB. In the period of step ST6, the controller MC controls the power source device 70 to apply the voltage VA and the voltage VB to the first electrode 22a and the second electrode 22b, respectively. In the period of step ST6, the heat transfer gas from the gas supply mechanism 86 is not supplied to the gap between the electrostatic chuck 22 and the edge ring ER. In the period of step ST6, the controller MC controls the gas supply mechanism 86 to stop the supply of the heat transfer gas. After step ST6, the processing from step ST2 is performed again. That is, the plasma processing in step ST2 is performed on the other substrate. Thereafter, steps ST3 to ST5 are performed. In a case where in step STJ following step ST5, it is determined that the end condition is satisfied, the method MT ends.

In step ST5 of the method MT, the third voltage V3 having a positive polarity and having a relatively low value is applied to the first electrode 22a extending relatively close to the electrostatic chuck 21, and the fourth voltage V4 having a negative polarity is applied to the second electrode 22b. As a result, according to the method MT, misalignment of another substrate that is transferred onto the electrostatic chuck 21 after the cleaning is prevented.

Hereinafter, first to sixth experiments performed for evaluation of the method MT will be described. In each of the first to sixth experiments, the plasma processing apparatus 1 was used. In each of the first to sixth experiments, first to sixth steps were repeatedly performed. The first step is the same step as step ST1, and in the first step, a sample substrate was transferred onto the electrostatic chuck 21 by using the transfer device TU2. During the period of the first step, a direct-current voltage of 2500 V was applied to the first electrode 22a and a direct-current voltage of −2500 V was applied to the second electrode 22b. The second step is the same step as step ST2, and during the period of the second step, a direct-current voltage of 4000 V was applied to the first electrode 22a and the second electrode 22b. During the period of the second step, plasma processing on the sample substrate was performed in the chamber 10. The third step is the same step as step ST3, and the sample substrate was transferred out of the chamber 10 by using the transfer device TU2. During the period of the third step, a direct-current voltage of 2500 V was applied to the first electrode 22a and a direct-current voltage of −2500 V was applied to the second electrode 22b. In the subsequent fourth step, the first cleaning described above was performed in a state where the edge ring ER was held by the electrostatic chuck 22. In the fourth step, a direct-current voltage of −4000 V was applied to the first electrode 22a and the second electrode 22b. In the subsequent fifth step, the second cleaning described above was performed in a state where the edge ring ER was held by the electrostatic chuck 22. In the fourth step and the fifth step, the heat transfer gas from the gas supply mechanism 86 was supplied to the gap between the electrostatic chuck 22 and the edge ring ER. The sixth step is the same step as step ST6, and the sample substrate was transferred onto the electrostatic chuck 21 by using the transfer device TU2.

The conditions of the fourth step and the fifth step in each of the first to sixth experiments are shown.

First Experiment

Figure 6A:
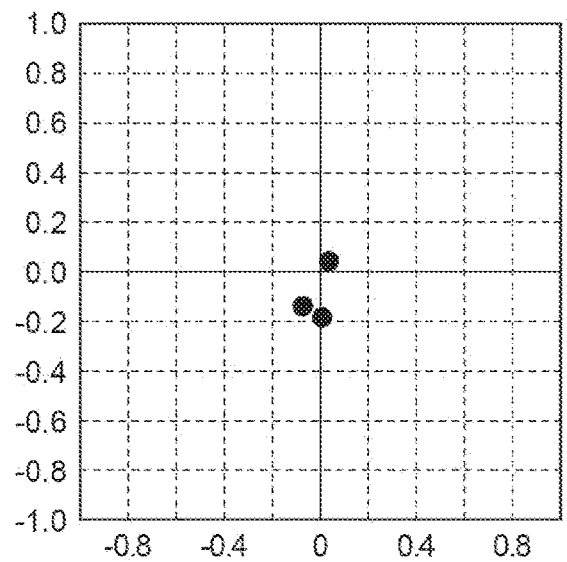
FIG. 6A illustrates a center position of a sample substrate measured in a first experiment.
Figure 6B:
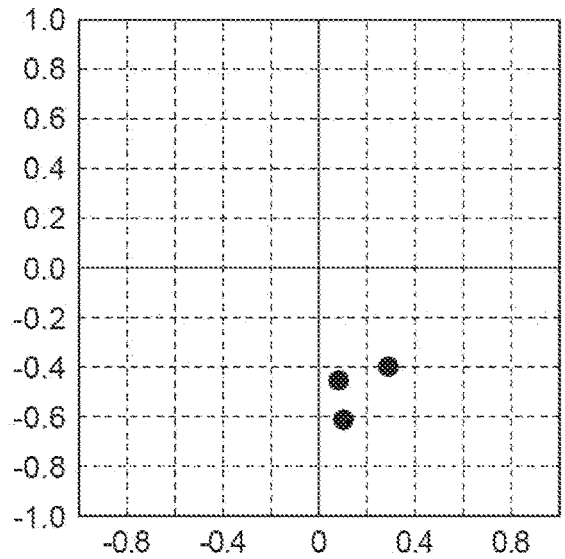
FIG. 6B illustrates a center position of a sample substrate measured in a second experiment.
Figure 6C:
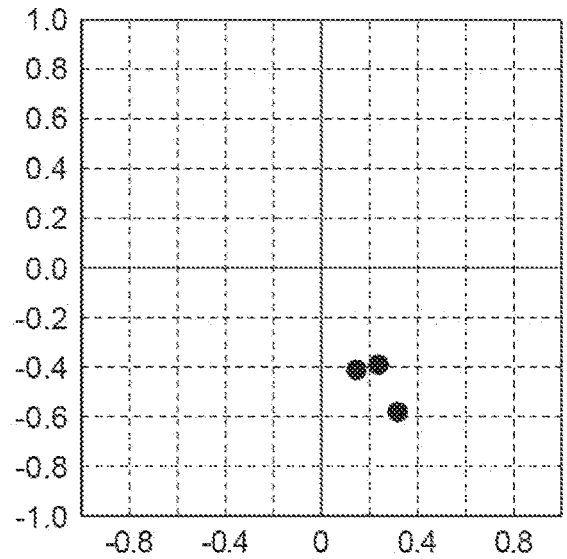
FIG. 6C illustrates a center position of a sample substrate measured in a third experiment.
Figure 7A:
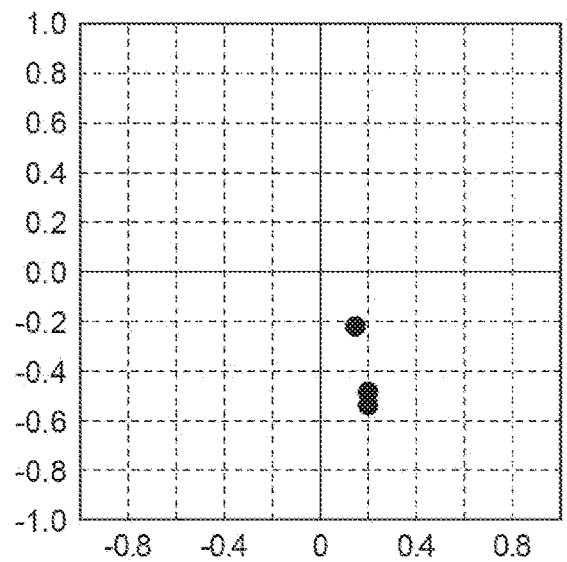
FIG. 7A illustrates a center position of a sample substrate measured in a fourth experiment.
Figure 7B:
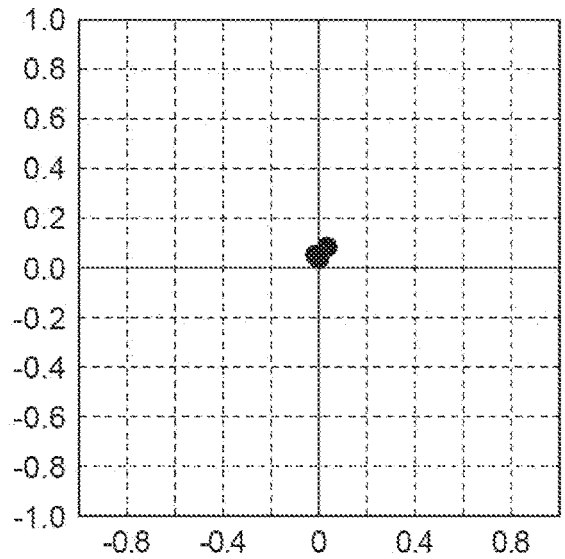
FIG. 7B illustrates a center position of a sample substrate measured in a fifth experiment.
Figure 7C:
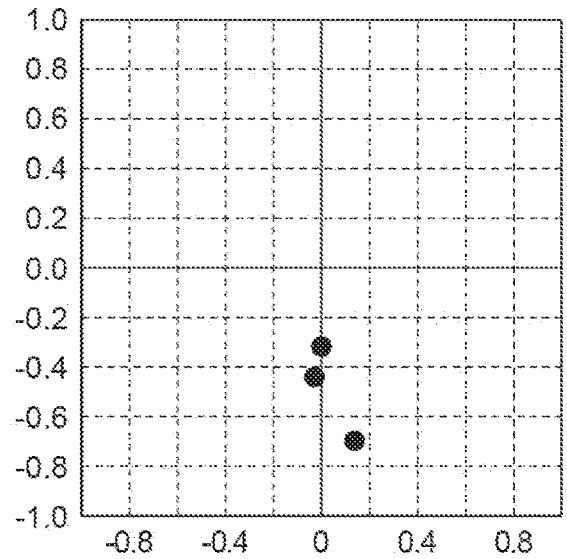
FIG. 7C illustrates a center position of a sample substrate measured in a sixth experiment.

Execution time of the fourth step: 335 seconds
Applied voltage to the first electrode 22a in the fifth step: 1000 V
Applied voltage to the second electrode 22b in the fifth step: −4000 V
Execution time of the fifth step: 25 seconds Second Experiment Execution time of the fourth step: 35 seconds
Applied voltage to the first electrode 22a in the fifth step: −4000 V
Applied voltage to the second electrode 22b in the fifth step: −4000 V
Execution time of the fifth step: 25 seconds Third Experiment Execution time of the fourth step: 35 seconds
Applied voltage to the first electrode 22a in the fifth step: 4000 V
Applied voltage to the second electrode 22b in the fifth step: −4000 V
Execution time of the fifth step: 25 seconds Fourth Experiment Execution time of the fourth step: 35 seconds
Applied voltage to the first electrode 22a in the fifth step: −3000 V
Applied voltage to the second electrode 22b in the fifth step: −3000 V
Execution time of the fifth step: 25 seconds Fifth Experiment Execution time of the fourth step: 35 seconds
Applied voltage to the first electrode 22a in the fifth step: 3000 V
Applied voltage to the second electrode 22b in the fifth step: −3000 V
Execution time of the fifth step: 25 seconds Sixth Experiment Execution time of the fourth step: 95 seconds
Applied voltage to the first electrode 22a in the fifth step: 3000 V
Applied voltage to the second electrode 22b in the fifth step: −3000 V
Execution time of the fifth step: 25 seconds In each of the first to sixth experiments, after the sixth step, the center position of the sample substrate with respect to a reference position on the electrostatic chuck 21 was measured. The reference position is a position on the axis AX. FIG. 6A shows the center position of the sample substrate measured in the first experiment, FIG. 6B shows a center position of a sample substrate measured in the second experiment, and FIG. 6C shows a center position of a sample substrate measured in the third experiment. FIG. 7A shows a center position of a sample substrate measured in the fourth experiment, FIG. 7B shows a center position of a sample substrate measured in the fifth experiment, and FIG. 7C shows a center position of a sample substrate measured in the sixth experiment. In these drawings, the center position of the sample substrate is represented as the distance [mm] thereof from the reference position (coordinates [0, 0]) in two orthogonal horizontal directions.

As shown in FIGS. 6B and 6C, in each of the second experiment and the third experiment, the amount of deviation of the center position of the sample substrate with respect to the reference position was large. That is, in a case where the absolute value of the voltages respectively applied to the first electrode 22a and the second electrode 22b are the same as each other in the second step, the fourth step, and the fifth step, the amount of deviation of the center position of the sample substrate with respect to the reference position was large. Further, as shown in FIG. 7A, also in the fourth experiment, the amount of deviation of the center position of the sample substrate with respect to the reference position was large. That is, in a case where the voltages respectively applied to the first electrode 22a and the second electrode 22b in the fourth step and the fifth step have the same polarity as each other even if they have small absolute values in Step ST5, the amount of deviation of the center position of the sample substrate with respect to the reference position was large. Further, as shown in FIG. 7B, in the fifth experiment, the amount of deviation of the center position of the sample substrate with respect to the reference position was small. That is, in a case where the positive voltage and the negative voltage, each of which has a small absolute value, are applied to the first electrode 22a and the second electrode 22b, respectively, in the fifth step, the amount of deviation of the center position of the sample substrate with respect to the reference position was small. However, as shown in FIG. 7C, in the sixth experiment, the amount of deviation of the center position of the sample substrate with respect to the reference position was large, although the time of the fourth step was merely lengthened as compared with the fifth experiment. In contrast, in the first experiment, the voltage applied to the first electrode 22a in the fifth step had a positive polarity. Further, in the first experiment, the absolute value of the voltage applied to the first electrode 22a in the fifth step was smaller than the absolute value of the voltage applied to the first electrode 22a in the fourth step. Further, in the first experiment, the absolute value of the voltage applied to the first electrode 22a in the fifth step was smaller than the absolute value of the negative voltage applied to the second electrode 22b in the fifth step. In the first experiment, although the execution time of the fourth step was long, the amount of deviation of the center position of the sample substrate from the reference position was small, as shown in FIG. 6A. Therefore, it was confirmed that the misalignment of the substrate can be suppressed in a case where the voltage which is applied to the first electrode 22a in step ST5 has a polarity opposite to the polarity of the voltage which is applied to the first electrode 22a in the immediately preceding step, and has a relatively small absolute value.

It should be noted that the absolute value of the direct-current voltage which is applied to each of the first electrode 22a and the second electrode 22b in step ST4 of the method MT may be larger than 4000 V. In step ST4 of the method MT, the direct-current voltage may be applied to each of the first electrode 22a and the second electrode 22b for a longer time (for example, a time of 600 seconds or more). In an example, in step ST4 of the method MT, the direct-current voltage may be applied to each of the first electrode 22a and the second electrode 22b for 900 seconds. Further, when the absolute value of the applied voltage to the first electrode 22a in step ST5 of the method MT is smaller than 4000 V, the deviation of the substrate which is transferred onto the electrostatic chuck 21 next is reduced.

While various exemplary embodiments have been described above, various additions, omissions, substitutions and changes may be made without being limited to the exemplary embodiments described above. Elements of the different embodiments may be combined to form another embodiment.

For example, the plasma processing apparatus to which the method MT is applied may be a plasma processing apparatus different from the plasma processing apparatus 1. In another embodiment, the plasma processing apparatus may be a capacitively coupled plasma processing apparatus different from the plasma processing apparatus 1. In still another embodiment, the plasma processing apparatus may be an inductively coupled plasma processing apparatus, an ECR (electron cyclotron resonance) plasma processing apparatus, or a plasma processing apparatus that generates plasma by using surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber;
   a substrate support configured to support a substrate in the chamber and having a first electrostatic chuck and a second electrostatic chuck, the first electrostatic chuck being configured to hold an edge ring placed thereon, the second electrostatic chuck being configured to hold the substrate placed thereon, the first electrostatic chuck having a first electrode and a second electrode, and the first electrode extending closer to the second electrostatic chuck than the second electrode;
   a power source device including one or more direct-current power sources and configured to generate a voltage to be applied to the first electrode and the second electrode; and
   a controller configured to control the power source device,
   wherein the controller is configured to
      control the power source device to apply a first constant voltage having a positive polarity to the first electrode and the second electrode in order to hold the edge ring by the first electrostatic chuck during plasma processing on the substrate placed on the second electrostatic chuck,
      control the power source device to apply a second constant voltage having a negative polarity to the first electrode and the second electrode in order to hold the edge ring by the first electrostatic chuck, in a first period after the plasma processing and after the substrate is transferred out of the chamber, wherein cleaning of the chamber using a plasma generated in the chamber is performed in the first period, and
      control the power source device to apply a third constant voltage to the first electrode and apply a fourth constant voltage to the second electrode, in order to hold the edge ring by the first electrostatic chuck, in a second period after the first period, wherein cleaning of the chamber is performed using a plasma generated in the chamber in the second period, and the third constant voltage has a positive polarity, the fourth constant voltage has a negative polarity, and an absolute value of the third constant voltage is smaller than an absolute value of the first constant voltage, an absolute value of the second constant voltage and an absolute value of the fourth constant voltage, such that the absolute value of the third constant voltage and the absolute value of the fourth constant voltage suppress misalignment of another substrate transferred onto the second electrostatic chuck after the cleaning of the chamber has been performed.

2. The plasma processing apparatus according to claim 1, wherein the absolute value of the fourth constant voltage is equal to the absolute value of the first constant voltage and the absolute value of the second constant voltage.

3. The plasma processing apparatus according to claim 1, wherein the absolute value of the second constant voltage is equal to the absolute value of the first constant voltage.

4. A substrate processing system comprising:
   the plasma processing apparatus according to claim 1; and
   a transfer robot,
   wherein the controller is configured to
      control the transfer robot to transfer an other substrate onto the second electrostatic chuck after the cleaning in the second period, and
      control the power source device to apply the first constant voltage to the first electrode and the second electrode in order to hold the edge ring by the first electrostatic chuck during the plasma processing on the other substrate placed on the second electrostatic chuck.

5. The plasma processing apparatus according to claim 1, further comprising:
   a gas line provided to supply a heat transfer gas to a gap between the first electrostatic chuck and the edge ring; and
   a gas supply for the heat transfer gas, connected to the gas line,
   wherein the controller is further configured to control the gas supply to supply the heat transfer gas to the gap via the gas line in the first period and the second period.

6. The plasma processing apparatus according to claim 1, wherein
   the controller is further configured to control the power source device to apply a fifth constant voltage to the first electrode and a sixth constant voltage to the second electrode during a period in which the substrate is transferred in the chamber and/or during a period in which the substrate is transferred out from the chamber, the fifth constant voltage and the sixth constant voltage having the respective polarities different from each other, and an absolute value of the fifth constant voltage and an absolute value of the sixth constant voltage being smaller than the absolute value of the first constant voltage and the absolute of the second constant voltage and being larger than the absolute value of the third constant voltage.

7. A substrate processing system comprising:
   a plasma processing apparatus including:
      a chamber;
      a substrate support configured to support a substrate in the chamber and having a first electrostatic chuck and a second electrostatic chuck, the first electrostatic chuck being configured to hold an edge ring placed thereon, the second electrostatic chuck being configured to hold the substrate placed thereon, the first electrostatic chuck having a first electrode and a second electrode, and the first electrode extending closer to the second electrostatic chuck than the second electrode;

a power source device including one or more direct-current power sources and configured to generate a voltage to be applied to the first electrode and the second electrode; and a controller configured to control the power source device; and a transfer robot, wherein the controller is configured to (a) control the power source device to apply constant voltages having different polarities to the first electrode and the second electrode, respectively, to hold the edge ring by the first electrostatic chuck during cleaning of the chamber using a plasma, wherein one of the constant voltages applied to the second electrode has a negative polarity, and an other of the constant voltages applied to the first electrode has a positive polarity and an absolute value which is smaller than an absolute value of the one of the constant voltages applied to the second electrode, and (b) control the transfer robot to transfer a substrate into a region surrounded by the edge ring and onto the second electrostatic chuck, after said (a), such that the absolute value of the other of the constant voltages applied to the first electrode and the absolute value of the one of the constant voltages applied to the second electrode suppress misalignment of the substrate transferred onto the second electrostatic chuck.

8. The substrate processing system according to claim 7, wherein the plasma processing apparatus further includes:

a gas line provided to supply a heat transfer gas to a gap between the first electrostatic chuck and the edge ring; and a gas supply for the heat transfer gas, connected to the gas line, and the controller is further configured to (c) control the power source device to apply a constant voltage having a negative polarity to the first electrode and the second electrode to hold the edge ring by the first electrostatic chuck, during a period in which cleaning of the chamber using a plasma generated in the chamber is performed and before a period in which said (a) is performed, and (d) control the gas supply to supply the heat transfer gas to the gap via the gas line during the period in which said (c) is performed and the period in which said (a) is performed.

9. The substrate processing system according to claim 8, wherein the controller is further configured to (e) control the power source device to apply constant voltages having different polarities to the first electrodes and the second electrodes during a period in which said (b) is performed and/or during a period in which the substrate is transferred out from a chamber, and absolute values of the constant voltages applied to the first electrode and the second electrodes in said (e) are smaller than an absolute value of the constant voltage applied to the first electrode and the second electrode in said (c), and larger than an absolute value of one of the constant voltages applied to the first electrode in said (a).

10. A holding method of an edge ring comprising:

applying a first constant voltage having a positive polarity to a first electrode and a second electrode of a first electrostatic chuck of a substrate support to hold an edge ring by the first electrostatic chuck during plasma processing on a substrate in a chamber of a plasma processing apparatus, wherein the plasma processing is performed in a state where the substrate is placed on a second electrostatic chuck of the substrate support in a region surrounded by the edge ring;

applying a second constant voltage having a negative polarity to the first electrode and the second electrode to hold the edge ring by the first electrostatic chuck in a first period after the plasma processing and after the substrate is transferred out of the chamber, wherein cleaning of the chamber is performed using a plasma generated in the chamber in the first period; and applying a third constant voltage and a fourth constant voltage to the first electrode and the second electrode, respectively, to hold the edge ring by the first electrostatic chuck in a second period after the first period, wherein cleaning of the chamber is performed using a plasma generated in the chamber in the second period, wherein the first electrode extends closer to the second electrostatic chuck than the second electrode, the third constant voltage has a positive polarity, the fourth constant voltage has a negative polarity, and an absolute value of the third constant voltage is smaller than an absolute value of the first constant voltage, an absolute value of the second constant voltage and an absolute value of the fourth constant voltage, such that the absolute value of the third constant voltage and the absolute value of the fourth constant voltage suppress misalignment of another substrate transferred onto the second electrostatic chuck after the cleaning of the chamber has been performed.

11. The holding method of an edge ring according to claim 10, wherein the absolute value of the third constant voltage is smaller than the absolute value of the fourth constant voltage.

12. The holding method of an edge ring according to claim 11, wherein the absolute value of the fourth constant voltage is equal to the absolute value of the first constant voltage and the absolute value of the second constant voltage.

13. The holding method of an edge ring according to claim 10, wherein the absolute value of the second constant voltage is equal to the absolute value of the first constant voltage.

14. The holding method of an edge ring according to claim 1, wherein the plasma generated in the first period is a plasma generated from oxygen gas, and the plasma generated in the second period is a plasma generated from nitrogen gas.

15. The holding method of an edge ring according to claim 10, further comprising:

transferring an other substrate onto the second electrostatic chuck by a transfer device, after said applying a third constant voltage and a fourth constant voltage, wherein the plasma processing is further performed on the other substrate in a state where the other substrate is placed on the second electrostatic chuck and the edge ring is held by the first electrostatic chuck by applying the first constant voltage to the first electrode and the second electrode.

* * * * *